(12) United States Patent
Qin

(10) Patent No.: US 9,263,480 B2
(45) Date of Patent: Feb. 16, 2016

(54) METHOD FOR FABRICATING ARRAY SUBSTRATE OF DISPLAY USING MULTIPLE PHOTORESISTS

(71) Applicant: BOE TECHNOLOGY GROUP CO., LTD., Beijing (CN)

(72) Inventor: Wei Qin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/350,892

(22) PCT Filed: Aug. 7, 2013

(86) PCT No.: PCT/CN2013/081018
§ 371 (c)(1),
(2) Date: Apr. 10, 2014

(87) PCT Pub. No.: WO2014/173039
PCT Pub. Date: Oct. 30, 2014

(65) Prior Publication Data
US 2015/0214247 A1    Jul. 30, 2015

(30) Foreign Application Priority Data

Apr. 26, 2013    (CN) .......................... 2013 1 0150826

(51) Int. Cl.
| | |
|---|---|
| *H01L 29/04* | (2006.01) |
| *H01L 27/12* | (2006.01) |
| *G02F 1/1362* | (2006.01) |
| *G02F 1/1343* | (2006.01) |

(52) U.S. Cl.
CPC ............ *H01L 27/127* (2013.01); *G02F 1/1362* (2013.01); *H01L 27/124* (2013.01); *H01L 27/1222* (2013.01); *H01L 27/1288* (2013.01); *G02F 1/136227* (2013.01); *G02F 2001/134372* (2013.01); *G02F 2001/136231* (2013.01)

(58) Field of Classification Search
None
See application file for complete search history.

(56) References Cited

U.S. PATENT DOCUMENTS

| | | | |
|---|---|---|---|
| 2006/0146245 A1* | 7/2006 | Ahn et al. | ..................... 349/139 |
| 2012/0138926 A1 | 6/2012 | Qin | |

FOREIGN PATENT DOCUMENTS

| | | |
|---|---|---|
| CN | 1797157 | 7/2006 |
| CN | 102456620 A | 5/2012 |
| CN | 203178640 | 9/2013 |

OTHER PUBLICATIONS

First Chinese Office Action dated Aug. 4, 2014; Appln. No. 201310150826.1.
Written Opinion of the International Searching Authority dated Jan. 22, 2014; PCT/CN2013/081018.

* cited by examiner

*Primary Examiner* — Michael Jung
*Assistant Examiner* — Mikka Liu
(74) *Attorney, Agent, or Firm* — Ladas & Parry LLP

(57) ABSTRACT

A fabricating method of an array substrate, an array substrate and a display device are provided. The array substrate includes a substrate; a plate electrode, a gate electrode, a gate line, a gate insulating film, semiconductor silicon islands, a source electrode, a drain electrode, a data line, a slit electrode formed on the substrate, and the substrate is also provided with a gate line through hole and a data line through hole. The gate electrode and the gate line include the first transparent conductive material and gate metal material stacked sequentially; the slit electrode is directly connected to the drain electrode; a second transparent conductive material is connected to the gate line through the gate line through hole; and connected to the data line through the data line through hole.

18 Claims, 9 Drawing Sheets

METHOD FOR FABRICATING ARRAY SUBSTRATE OF DISPLAY USING MULTIPLE PHOTORESISTS

BACKGROUND

The embodiments of present invention relate to a fabricating method of an array substrate, an array substrate and a display device.

With the maturity of the photoelectric display technique, the panel display apparatus has found increasingly wider applications. Thin Film Transistor Liquid Crystal Display (TFT-LCD) has become the main research trend for the display device products so as to gradually replace the traditional ray tube display device in recent years, due to its characteristics such as longer service time, higher photo-efficiency, lower radiation and lower power consumption.

The TFT-LCD is formed with an array substrate and a color filter substrate by a cell-assembly process. A liquid crystal is injected between the array substrate and the color filter substrate. Generally, the array substrate comprises a substrate, and a gate metal film, a gate insulating film, a semiconductor film, a source-drain metal film and a transparent conductive film provided on the substrate. To ensure insulation among structural units in the array substrate, it's usually required to arrange insulating layers between the gate metal film and the transparent conductive film, and between the source-drain metal film and the transparent conductive film. The gate metal film is used to form a gate electrode and a gate line, the source-drain metal film is used to form a source electrode, a drain electrode and a data line, and the transparent conductive film is used to form a common electrode or a pixel electrode etc.

Conventionally, the drain electrode is usually connected to the pixel electrode through a via hole. Furthermore, it is also necessary to provide the array substrate with a gate line through hole and a data line through hole. It's necessary for the gate line through hole to pass through several layers above the gate metal film and reach the gate metal film, so as to achieve the connection between the gate line and an external signal input apparatus, and thus providing electrical signals to the gate line; whereas the data line through hole passes through several layers above the source-drain metal film and reaches the source-drain metal film, so as to achieve the connection between the data line and the external signal input apparatus and thus providing electrical signals to the data line.

In an example of a conventional array substrate operated in a fringe field switching mode using the Advanced Super Dimension Switch (ADS) technology, the fabricating method of the array substrate requires five patterning processes as following: forming a first transparent conductive film comprising a plate electrode pattern in a first patterning process, forming the gate metal film comprising a pattern of the gate electrode and the gate line in a second patterning process, forming the semiconductor film comprising a pattern of the source electrode, the drain electrode, the data line, the semiconductor silicon islands in the third patterning process, forming an insulating layer comprising the via hole for the electrical connection between the drain electrode and the slit electrode, the gate line through hole and the data line through hole in a fourth patterning process, and finally forming the second transparent conductive film comprising the slit electrode in a fifth patterning process.

It is found that a conventional fabricating method of the array substrate has at least the following problems such as long production cycle, high fabrication cost and low yield due to numerous patterning processes.

SUMMARY

One embodiment according to the present invention provides a fabricating method of an array substrate, comprising following steps of: forming a first transparent conductive film and a gate metal film sequentially, forming a first photoresist on the gate metal film, forming a pattern comprising a gate electrode, a gate line, and a plate electrode by a patterning process, and keeping a part of the first photoresist at a position corresponding to a gate line through hole; forming a gate insulating film, a semiconductor film and a source-drain metal film sequentially; removing the first photoresist at a position corresponding to the gate line through hole, and at the same time removing the gate insulating film, the semiconductor film and the source-drain metal film formed above the first photoresist at a position corresponding to the gate line through hole; forming a second photoresist, and forming a pattern comprising a source electrode, a drain electrode, a data line and a semiconductor silicon island by a patterning process; and forming a second transparent conductive film, a third photoresist, and forming a pattern comprising a slit electrode by a patterning process.

In one example, the step of forming the second transparent conductive film, the third photoresist and forming a pattern comprising the slit electrode by the patterning process comprises: forming a pattern comprising the slit electrode and keeping the third photoresist at the position corresponding to the slit electrode, the gate line through hole and the data line through hole.

In one example, after the step of forming the second transparent conductive film, the third photoresist and forming the pattern comprising the slit electrode by the patterning process, the fabricating method further comprises: forming a passivation layer; and removing the third photoresist at a position corresponding to the slit electrode, the gate line through hole, and the data line through hole, and at the same time, removing the passivation layer formed above the third photoresist at the position corresponding to the slit electrode, the gate line through hole and the data line through hole, so as to form a passivation layer pattern comprising the gate line through hole and the data line through hole.

In one example, the step of forming the first photoresist, forming a pattern comprising the gate electrode, the gate line, and the plate electrode by the patterning process and keeping the first photoresist at the position corresponding to the gate line through hole comprises steps of: forming the first photoresist; forming a first sub-photoresist at a position corresponding to the gate electrode and the gate line, forming a second sub-photoresist at a position corresponding to the plate electrode, and forming a third sub-photoresist at a position corresponding to the gate line through hole, by the patterning process; and the third sub-photoresist has a thickness greater than that of the first sub-photoresist, and the thickness of the first sub-photoresist is greater than that of the second sub-photoresist; removing the first transparent conductive film and the gate metal film not covered by the first sub-photoresist, the second sub-photoresist and the third sub-photoresist; removing all the second sub-photoresist, and removing partial thickness of the first and third sub-photoresist; removing the gate metal film corresponding to the second sub-photoresist so as to form a pattern comprising the plate electrode; and removing the remaining first sub-photoresist to expose the pattern comprising the gate line and the gate electrode, and removing partial thickness of the third sub-photoresist and keeping the remaining third sub-photoresist.

In one example, the first sub-photoresist has a thickness of 1-4 μm, the second sub-photoresist has a thickness of 0.5-2 μm, and the third sub-photoresist has a thickness of 2-6 μm.

In one example, the step of forming the second photoresist, and forming a pattern comprising the source electrode, the drain electrode, the data line and the semiconductor silicon island comprises the steps of: forming the second photoresist; forming a fourth sub-photoresist at a position corresponding to the semiconductor silicon island, and forming a fifth sub-photoresist at a position corresponding to the source electrode, the drain electrode, the data line, the gate line through hole and the data line through hole; and the fifth sub-photoresist has a thickness greater than that of the fourth sub-photoresist; removing the semiconductor film and the source-drain metal film not covered by the fourth sub-photoresist and the fifth sub-photoresist; removing all the fourth sub-photoresist and partial thickness of the fifth sub-photoresist; removing the source-drain metal film and a part of the semiconductor film at the position corresponding to the fourth sub-photoresist, so as to form a pattern comprising the source electrode, the drain electrode, the data line and the semiconductor silicon island; and removing the remaining fifth sub-photoresist.

In one example, the fourth sub-photoresist has a thickness of 0.5-1 μm, and the fifth sub-photoresist has a thickness of 1-2 μm.

In one example, the semiconductor film comprises a semiconductor film and a doped semiconductor film stacked sequentially, and the step of removing the source-drain metal film and a part of the semiconductor film at a position corresponding to the fourth sub-photoresist comprises: removing the source-drain metal film and the doped semiconductor film at the position corresponding to the fourth sub-photoresist to expose the semiconductor film.

Another embodiment of the present invention provides an array substrate comprising a substrate, a plate electrode, a gate electrode, a gate line, a gate insulating film, a semiconductor silicon island, a source electrode, a drain electrode, a data line, a slit electrode formed on the substrate, and the substrate is also provided with a gate line through hole and a data line through hole. The gate electrode and the gate line comprise the first transparent conductive material and gate metal material stacked sequentially; the slit electrode is directly connected to the drain electrode; a second transparent conductive material is connected to the gate line through the gate line through hole; and connected to the data line through the data line through hole.

In one example, the plate electrode and the first transparent conductive material are arranged at the same layer and made of the same material.

In one example, the slit electrode and the second transparent conductive material are arranged at the same layer and made of the same material.

In one example, the source electrode and the drain electrode are arranged above the semiconductor silicon island, and the array substrate further comprise a semiconductor layer arranged below the data line and at the same layer with the semiconductor silicon island.

In one example, the gate insulating film is arranged between the gate electrode and the semiconductor silicon island as well as between the plate electrode and the slit electrode.

In one example, the array substrate further comprise an insulation protecting structure above the source electrode, the drain electrode, the data line and the semiconductor silicon island.

Still another embodiment according to the present invention provides a display device comprising the array substrate according to any one of the embodiments of the present invention.

In the fabricating method of the array substrate, the array substrate and the display device according to the embodiment of present invention, the gate metal film is directly arranged on the first transparent conductive film, thereby a pattern comprising the gate electrode, the gate line and the plate electrode is formed in a single patterning process; the second transparent conductive film is directly arranged on the source-drain metal film, such that the slit electrode is directly connected to the drain electrode without providing additional via hole; and furthermore, the gate line through hole and the data line through hole are formed during the fabrication process without separate patterning process. According to the fabricating method of the array substrate, the array substrate and the display device of the embodiment of present invention, the patterning process is reduced to three times, thus the cost is reduced effectively and the yield is improved.

BRIEF DESCRIPTION OF THE DRAWINGS

In the following, the drawings of the embodiment of present invention will be described briefly in order to describe the technical solutions of the embodiments more clearly, and ifs obvious that the drawings described hereinafter just relate to some embodiments of the present invention, rather than limitation to the present invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can implement other embodiment(s), without any creative work, which should fall within the scope of the invention.

Hereinafter, an array substrate and a fabricating method of the array substrate will be described in detail as following in the embodiments.

Figure 1:
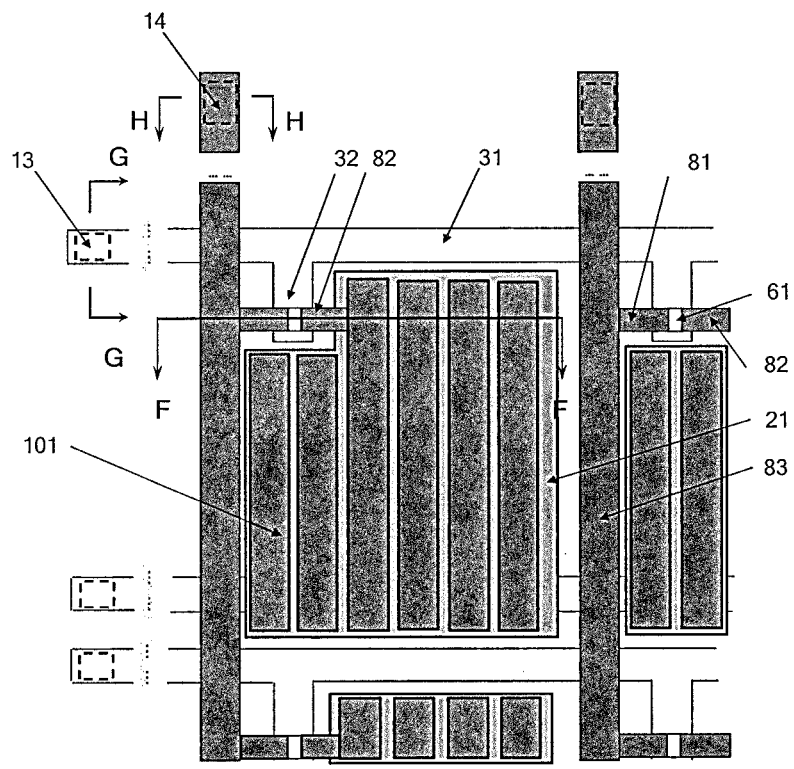
FIG. 1 is a schematic plan view of an array substrate according to an embodiment of present invention.
Figure 2:
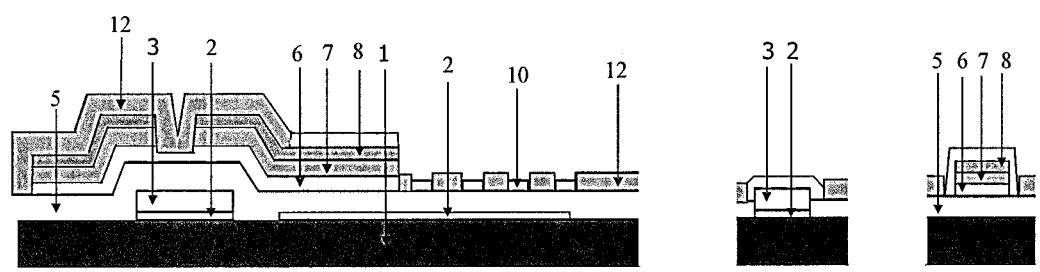
FIG. 2 is a sectional view along the F-F, G-G and H-H directions of FIG. 1 in the fifth state.

FIG. 1 is a schematic plan view of an array substrate according to the embodiment of present invention, FIG. 2 is a sectional view taken along the F-F, G-G, and H-H directions of FIG. 1, and more specifically, the sectional view is a sectional view taken along the F-F, G-G and H-H directions of FIG. 1 in the fifth state of the fabricating method of the array substrate which will be described hereinafter.

Referring FIGS. 1 and 2, the array substrate of this embodiment comprises: a substrate 1, which for example can be a glass substrate or a quartz substrate; a plate electrode 21, which is formed by a first transparent conductive film 2 made of first transparent conductive materials.

The array substrate of this embodiment further comprises a gate line 31 and a gate electrode 32 which comprise a metal material and a first transparent conductive material, respectively. For example, the metal material is formed by a gate metal film 3, and the first transparent conductive material is formed by the first transparent conductive film 2, and the gate metal film 3 is directly arranged on the first transparent conductive film 2. It is noted that in the embodiment of present invention, the gate line 31 and the gate electrode 32 have a bi-layer configuration consisting of the metal material and the first transparent conductive material, therefore such a design may effectively reduce the resistance of the gate line 31 and the gate electrode 32, and decrease the power consumption of the array substrate. For example, the first transparent conductive material in the gate line and the gate electrode and the first transparent conductive material of the plate electrode are located at the same layer, and are made of the same materials.

The array substrate of this embodiment further comprises a gate insulating film 5, a semiconductor silicon island 61; a source electrode 81, a drain electrode 82 and a data line 83. The source electrode 81, the drain electrode 82 and the data line 83 are formed by the source-drain metal film 8 made of metal materials.

The array substrate of this embodiment further comprises a slit electrode 101 formed by a second transparent conductive film 10 made of a second transparent conductive material. For example, the slit electrode 101 is directly connected to the drain electrode 82, that is, the second transparent conductive film 10 is directly formed on the source-drain metal film 8, thereby the slit electrode 101 and the drain electrode 82 may be directly connected to each other, thus saving the provision of an insulating layer structure and the via holes. As shown in FIG. 1, the slit electrode 101 is shown as a plurality of separate strip structures. However, the slit electrode is only schematically illustrated here. The slit electrode of the present embodiment is not limited to this structure. For the convenience of applying signals to the slit electrode, in each pixel, individual strip structures of the slit electrode may be interconnected together.

It is noted that the plate electrode 21 and the slit electrode 101 correspond to each other so as to generate an effect of multi-dimensional electric fields. Hence, there may be various possible cases for the plate electrode 21 and the slit electrode 101. For example: as shown in FIG. 2, the slit electrode is provided with a plurality of slits so as to cooperate with the plate electrode to generate the effect of multi-dimensional electric fields, thus forming an ADS-based array substrate with high aperture ratio.

The array substrate of this embodiment further comprises a passivation layer 12, forming an insulation protecting structure (for example, a passivation layer) at the position corresponding to the source electrode 81, the drain electrode 82, the data line 83 and the semiconductor silicon island 61 connecting with the source electrode and the drain electrode.

In addition, the substrate 1 is also provided with the gate line through hole 13 and the data line through hole 14. The section taken along the G-G direction of FIG. 1 is at a position where the gate line through hole 13 is arranged, and the section along the H-H direction of FIG. 1 is taken at a position where the data line through hole 14 is arranged. The gate line through hole 13 is used for connecting the gate line 31 with an external signal input apparatus (not shown), so as to supply the gate line 31 with electrical signals; and the data line through hole 14 is used for connecting the data line 83 with the external signal input apparatus (not shown), so as to supply the data line 83 with electrical signals;

In one implementation, the second transparent conductive material is connected to the gate line 31 through the gate line through hole 13; and the second transparent conductive material is connected to the data line 83 through the data line through hole 14. In view of the fabrication process of the array substrate, the gate line through hole 13 and the data line through hole 14 are formed in the fabrication process, rather than in a patterning process after the formation of the passivation layer, thus the number of patterning process during the fabrication process of the array substrate according to the embodiment of present invention is reduced, and thereby effectively reducing the cost and improving the yield of the array substrate. For example, the second transparent conductive material of the slit electrode and the second transparent conductive material of the gate line and the data line are provided at the same layer and are made of the same material.

Moreover, since the data line and the semiconductor silicon island are formed in the same patterning process, a semiconductor layer remains at the same layer as the semiconductor silicon island below the data line.

In one example, as shown in FIGS. 1 and 2, the gate insulating film is arranged between the gate electrode 32 and the semiconductor silicon island 61 as well as between the plate electrode 21 and the slit electrode 101.

Furthermore, it is noted that the naming of the source electrode and the drain electrode in the array substrate will be different due to variance of current direction, and for the convenience of description in the present invention, the electrode connected to the slit electrode is called as the drain electrode.

In the array substrate according to the embodiment of present invention, the gate metal film is directly arranged on the first transparent conductive film, thereby a pattern comprising the gate electrode, the gate line and the plate electrode is obtained in a single patterning process. The second transparent conductive film is directly arranged on the source-drain metal film, such that the slit electrode is directly connected to the drain electrode without providing additional via hole. Furthermore, the gate line through hole and the data line through hole are formed during the fabrication process, and no separate patterning process is needed to form the gate line through hole and the data line through hole. According to the fabricating method of the array substrate, the array substrate and the display device according to the embodiment of present invention, the number of patterning processes is reduced to three, thus the cost is reduced effectively and the yield is improved.

In another aspect of the above embodiments, the embodiment of present invention also provides a fabricating method of the array substrate according to the embodiment of present invention. According to the fabricating method of the array substrate according to the embodiment of present invention, the number of the patterning processes is reduced, so that the production cost is reduced and the yield is improved.

Figure 3:
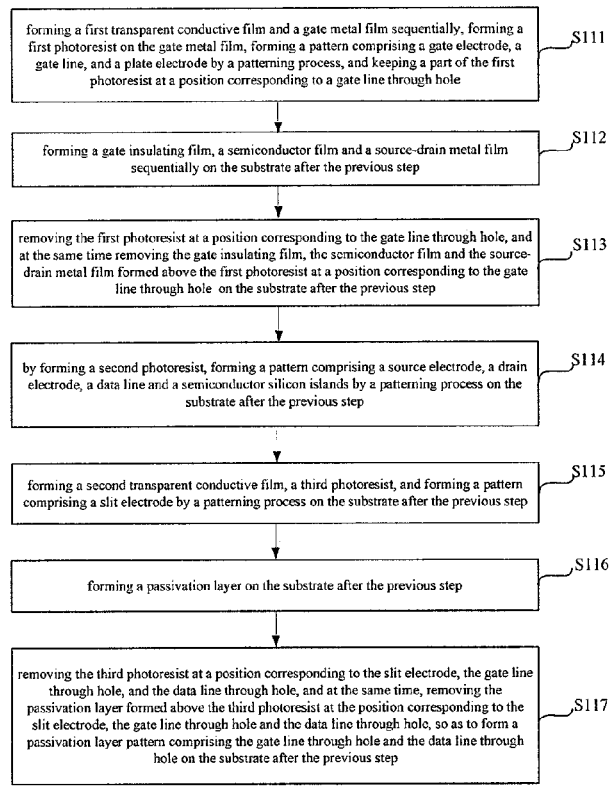
FIG. 3 is a flow chart illustrating a fabricating method of the array substrate according to the embodiment of present invention.

As shown in FIG. 3, the fabricating method according to the embodiment of present invention comprises following steps.

S111, the first transparent conductive film and the gate metal film are formed sequentially; the first photoresist is formed, a pattern comprising the gate electrode, the gate line and the plate electrode is formed in a patterning process, and the first photoresist at the position corresponding to the gate line through hole remains.

In particular, the patterning process of the present invention comprises the process steps of coating, exposing, developing, etching, stripping the photoresist etc.

Figure 4:
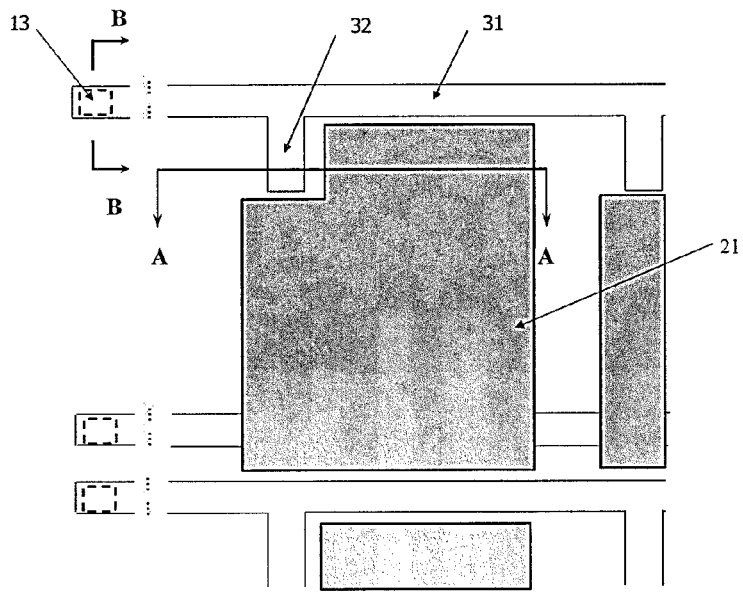
FIG. 4 is a schematic plan view of the array substrate after a first patterning process according to the embodiment of present invention.

Referring to FIGS. 4 to 10, optionally the steps may be carried out in the following manner. FIG. 4 is a structural schematic view showing the array substrate formed after this step, FIGS. 5 to 10 are different state views of the cross sections taken along the directions A-A and B-B of FIG. 4 after respective processing steps, and the section taken along the B-B direction is at a position where the gate line through hole is arranged.

Figure 5:
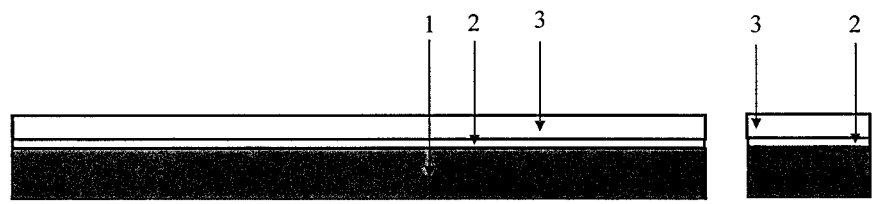
FIG. 5 is a sectional view along the-A and B-B directions of FIG. 4 in the first state.

In this step, as shown in FIG. 5, the first transparent conductive film 2 is firstly deposited on the substrate 1. The substrate 1 may be a transparent glass substrate and may also be a quartz substrate. Specifically, a layer of first transparent conductive material with a thickness of 100~1000 Å is deposited on the substrate 1 by a sputtering or a thermal evaporation method. The first transparent conductive material could be selected from indium tin oxide (ITO), indium zinc oxide (IZO) and the like. Then a gate metal film 3 is deposited on the first transparent conductive film 2. Specifically, a layer of metal film with a thickness of 500~4000 Å is deposited on the first transparent conductive film 2 by a sputtering or a thermal evaporation method. The gate metal film 3 may be selected from Cr, W, Ti, Ta, Mo, Al, Cu and similar metals as well as alloy thereof. The gate metal film 3 may also have a composite film layer structure consisting of a plurality of metal films. The present invention is not limited thereto.

Figure 6:
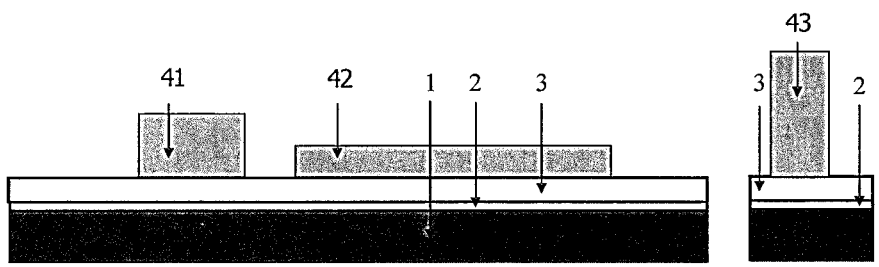
FIG. 6 is a sectional view along the-A and B-B directions of FIG. 4 in the second state.

As shown in FIG. 6, on the substrate after the above steps, a first photoresist is applied on the gate metal film 3, and a pattern of the first photoresist is formed in a patterning process. Specifically, the pattern of the first photoresist comprises a pattern of the first sub-photoresist 41, a second sub-photoresist 42 and a third sub-photoresist 43. The first sub-photoresist 41 is formed at a position corresponding to the gate line and the gate electrode, the second sub-photoresist 42 is formed at a position corresponding to the plate electrode, and the third sub-photoresist 43 is formed at a position corresponding to the gate line through hole. For example, a half tone mask may be used to carry out the exposing and developing processes, such that the thickness of the third sub-photoresist 43 is greater than that of the first sub-photoresist 41, and the thickness of the first sub-photoresist 41 is greater than that of the second sub-photoresist 42 (see FIG. 6). For example, the first sub-photoresist 41 has a thickness of about 1~4 μm, the second sub-photoresist 42 has a thickness of about 0.5~2 μm, and the third sub-photoresist 43 has a thickness of about 2~6 μm. For example, the first sub-photoresist 41 has a thickness of about 1 μm, the second sub-photoresist 42 has a thickness of 0.5 μm, and the third sub-photoresist 43 has a thickness of 2 μm.

Figure 7:
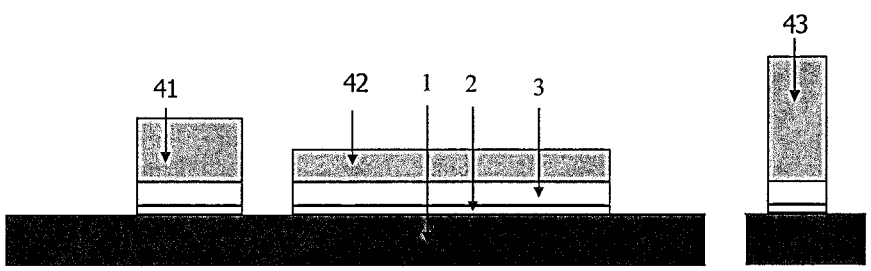
FIG. 7 is a sectional view along the-A and B-B directions of FIG. 4 in the third state.

As shown in FIG. 7, the substrate after the above steps is subjected to etching, so as to etch off a part of the gate metal film 3 and the first transparent conductive film 2 not protected by the photoresist (i.e., the first to third sub-photoresist), thereby forming a pattern comprising the gate line, the gate electrode and the plate electrode. In particular, a chemical process can be carried out to implement an acid etching. The acid may be selected from a sulfuric acid, nitric acid, acetic acid and mixed acid with a certain concentration, so as to etch out a pattern of the gate line and the gate electrode and a pattern of the plate electrode.

Figure 8:
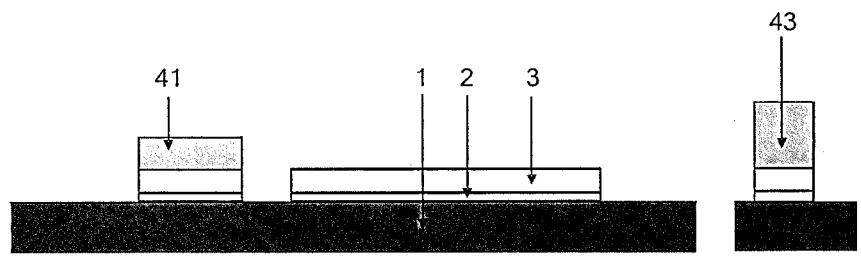
FIG. 8 is a sectional view along the-A and B-B directions of FIG. 4 in the fourth state.

As shown in FIG. 8, on the substrate after the above steps, a dry ashing process is performed for thinning the first photoresist. Specifically, the thinning of the first photoresist may be carried out under an oxygen containing atmosphere, thereby removing the entire second sub-photoresist 42 and partial thickness of the first sub-photoresist 41 and the third sub-photoresist 43. Specifically, the first sub-photoresist 41 may have a remaining thickness of about 0.5~2 μm after the ashing process, and the third sub-photoresist 43 may be have a remaining thickness of about 1~4 μm after the ashing process. After the dry ashing process, states of the cross sections taken along the directions A-A, B-B in FIG. 4 are shown in FIG. 8, which illustrates a sectional view of the fourth state.

Figure 9:
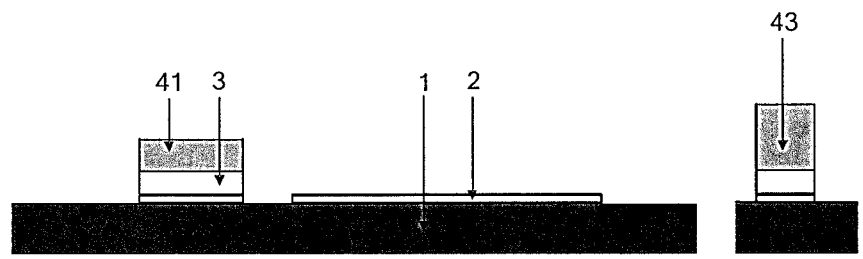
FIG. 9 is a sectional view along the-A and B-B directions of FIG. 4 in the fifth state.

As shown in FIG. 9, the substrate after the above steps is subjected to etching so as to etch off a part of the gate metal film 3 not protected by the photoresist (i.e., the part corresponding to the second sub-photoresist), thereby removing the gate metal film 3 above the plate electrode. In particular, a chemical process can be used to implement an acid etching, the acid may be a molybdenum etching solution with a certain concentration. It is noted that the purpose of this step is to remove the gate metal film 3 above the plate electrode and keep the plate electrode. Therefore, the etching solution used in this step has a strong corrosive effect on the gate metal material and a weak corrosive effect on the transparent conductive material. After the etching process, as shown in FIG. 9, the plate electrode only comprises the first transparent conductive material, and the gate metal material previously covering the plate electrode is etched off by the acid. In addition, the photoresist covers the gate electrode and the gate line, thus the gate electrode and the gate line still have a bi-layer configuration comprising the first transparent conductive material and the gate metal material. States of the cross sections taken along directions A-A and B-B of FIG. 4 are illustrated in FIG. 9, which illustrates a sectional view of the fifth state.

Figure 10:
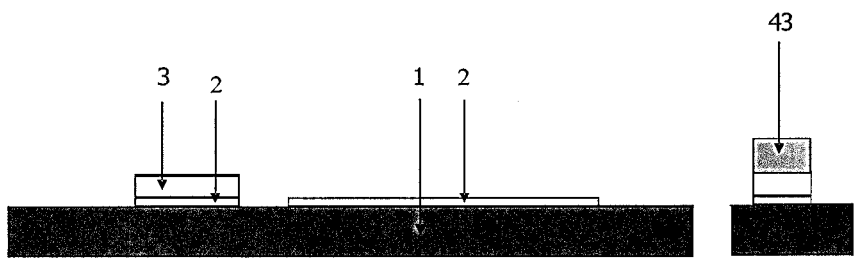
FIG. 10 is a sectional view along the-A and B-B directions of FIG. 4 in the sixth state.

As shown in FIG. 10, the substrate after the above steps is subjected to a dry ashing process for thinning the first photoresist again, and in particular, the thinning of the first photoresist may be carried out under an oxygen containing atmosphere, thus removing all of the first sub-photoresist 41 and a partial thickness of the third sub-photoresist 43. After this step, the pattern comprising the gate line and the gate electrode is exposed. In particular, the remaining thickness of the third sub-photoresist 43 after the ashing process is about 0.5~2 μm, and since the third sub-photoresist 43 is formed at a position corresponding to the gate line through hole 13, the photoresist still remains at the position corresponding to the gate line through hole 13. After the dry ashing process, states of the cross sections taken along the directions A-A, B-B in FIG. 4 are shown in FIG. 10, which illustrates a sectional view of the sixth state.

After the above processes, the array substrate configuration is formed as shown in FIG. 4.

It is understood that, in the embodiment of present invention, each of the drawings is part of the array substrate for convenience of understanding. The array substrate actually comprises a plurality of the part shown in the drawings.

S112, on the substrate after the above steps, the gate insulating film, the semiconductor film and the source-drain metal film are formed sequentially.

Figure 11:
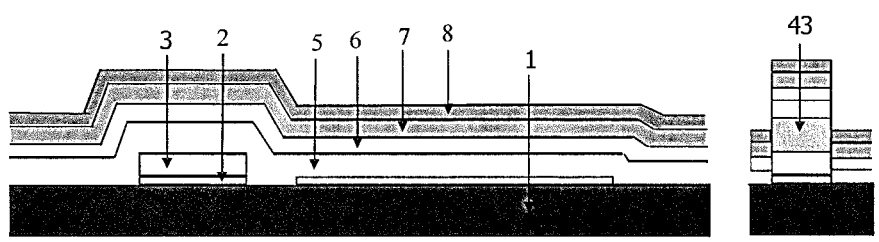
FIG. 11 is a sectional view along the-A and B-B directions of FIG. 4 in the seventh state.

In this step, the substrate 1 after the above steps, is subjected to deposition of multilayer films, thus forming the gate electrode insulation film 5, the semiconductor film and the source-drain metal film 8. It is noted that the semiconductor film may comprise an amorphous silicon semiconductor film 6 and a doped layer 7. For example, the doped layer 7 may be a N-type doped semiconductor layer. After this step, states of the cross sections taken along directions A-A, B-B in FIG. 4 are shown in FIG. 11, which illustrates a sectional view of the seventh state. Since in step S111, the first photoresist of a certain thickness remains at the position corresponding to the gate line through hole 13, accordingly, the multilayer films deposited in this step are all deposited on the remaining first photoresist.

Specifically, the gate electrode insulation film 5 of 1000~6000 Å, the amorphous silicon semiconductor film 6 of 1000~6000 Å, the N-type doped semiconductor layer 7 of 200~4000 Å and the source-drain metal film 8 of 1000~7000 Å can be deposited by the Chemical Vapor Deposition (CVD). The material of the gate electrode insulation film 5 generally may be silicon nitride material, and may also be silicon oxide and silicon oxynitride and other materials. Other methods may also be used to deposit the multi-layer. The present invention is not limited thereto.

S113, on the substrate after the above steps, the first photoresist at the position corresponding to the gate line through hole is removed, and at the same time the gate insulating film, the semiconductor film and the source-drain metal film formed above the first photoresist at the position corresponding to the gate line through hole are also removed.

Figure 12:
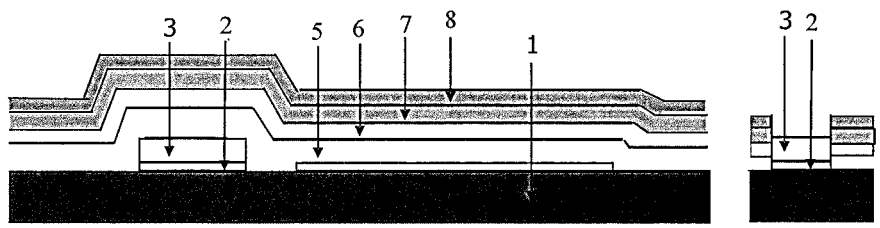
FIG. 12 is a sectional view along the-A and B-B directions of FIG. 4 in the eighth state.

Specifically, in this step, the first photoresist remaining at the position corresponding to the gate line through hole is removed by a stripping process, so that the gate electrode insulation film 5, the semiconductor film (comprising the amorphous silicon semiconductor film 6 and the N-type doped semiconductor layer 7) and the source-drain metal film 8 are stripped off together, thus forming a configuration of the gate line through hole shown in FIG. 12.

After this step, states of the cross sections taken along the directions A-A, B-B in FIG. 4 are shown in FIG. 10, which illustrates a sectional view of the eighth state.

S114, the second photoresist is formed on the substrate after the above steps, and a pattern comprising the source electrode, the drain electrode, the data line and the semiconductor silicon island are formed in a patterning process.

Figure 13:
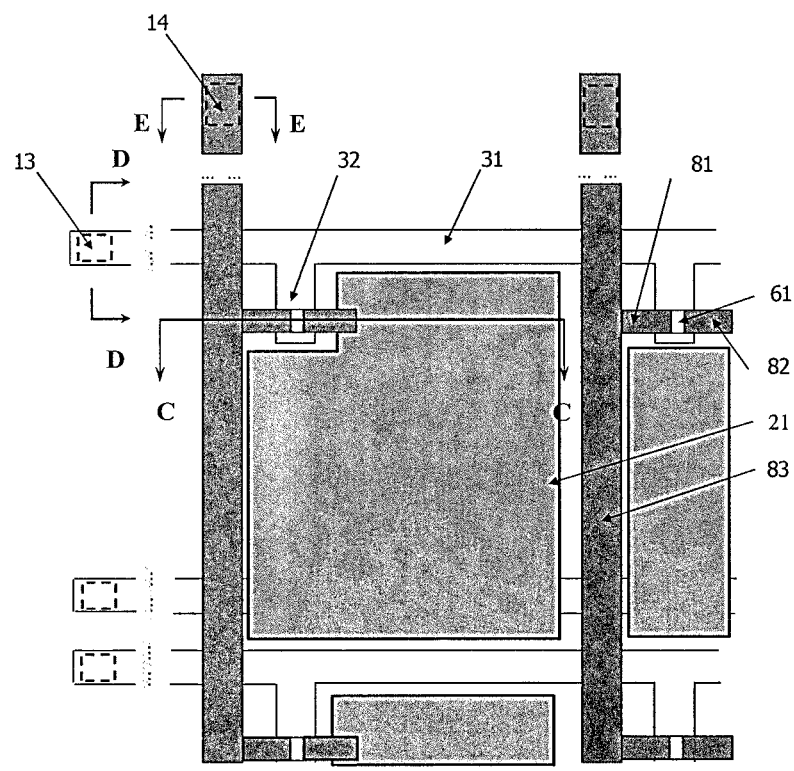
FIG. 13 is a schematic plan view of the array substrate after a second patterning process according to the embodiment of present invention.

Referring to FIGS. 13-18, optionally, this step may be carried out in the following manner. In particular, FIG. 13 is a structural schematic view of the array substrate formed after this step, FIGS. 14-18 are sectional views of the cross sections taken along the directions C-C, D-D and E-E of FIG. 13 after the respective processing steps in different states. The section taken along the direction D-D is at a position where the gate line through hole is arranged, and the section taken along direction E-E is at a position where the data line through hole is arranged.

Firstly, the second photoresist is applied on the substrate 1 after the above steps, a pattern of the second photoresist is formed in a patterning process, and the second photoresist is formed at the position corresponding to the gate line through hole so as to protect the gate line through hole from the subsequent etching steps.

Figure 14:
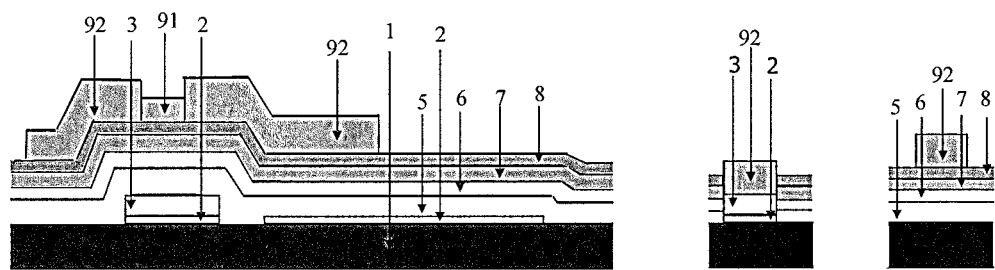
FIG. 14 is a sectional view along the C-C, D-D and E-E directions of FIG. 13 in the first state.

Specifically, the second photoresist is applied, and a pattern of the second photoresist is formed on the substrate in a patterning process. The pattern of the second photoresist comprises patterns of the fourth sub-photoresist 91 and the fifth sub-photoresist 92. The fourth sub-photoresist 91 is formed at a position corresponding to the semiconductor silicon island which connects the source electrode and the drain electrode, the fifth sub-photoresist 92 is formed at a position corresponding to the source electrode, the drain electrode, the data line and the gate line through hole. For example, a half tone mask may be used in the exposing process, so that the fifth sub-photoresist 92 has a thickness greater than that of the fourth sub-photoresist 91 (see FIG. 14). After this step, states of the cross sections taken along the directions C-C, D-D and E-E in FIG. 13 are shown in FIG. 14, which illustrates a sectional view of the first state.

As shown in FIG. 12, etching process is performed on the substrate after the above step so as to etch a part of the semiconductor film (comprising the amorphous silicon semiconductor film 6 and the N-type doped layer 7) and the source-drain metal film 8 not protected by the second photoresist, thereby forming a pattern comprising the source electrode, the drain electrode, and the data line. Optionally, a dry or wet etching process is firstly carried out to remove the source-drain metal film 8 exposed by the pattern of the second photoresist; and then, the semiconductor film (comprising the morphous silicon semiconductor film 6 and the N-type doped semiconductor layer 7) exposed by the pattern of the second photoresist is subjected to a dry or wet etching, thereby forming a pattern of the source electrode 81, the drain electrode 82, and the data line 83.

Figure 15:
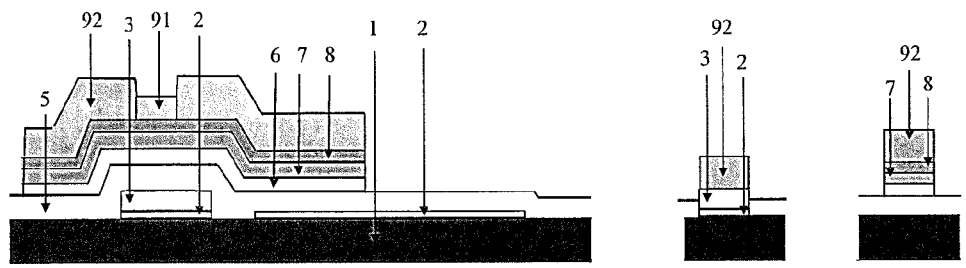
FIG. 15 is a sectional view along the C-C, D-D and E-E directions of FIG. 13 in the second state.

After this step, states of the cross sections taken along the directions C-C, D-D and E-E in FIG. 13 are shown in FIG. 15, which illustrates a sectional view of the second state. It is noted that the fifth sub-photoresist 92 is provided at a position corresponding to the gate line through hole, hence the etching of the semiconductor film and the source-drain metal film has no influence on the gate line through hole.

Figure 16:
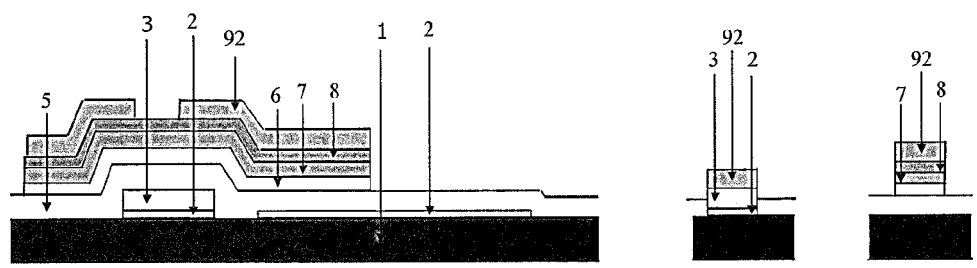
FIG. 16 is a sectional view along the C-C, D-D and E-E directions of FIG. 13 in the third state.

As shown in FIG. 16, the substrate after the above steps is subjected to a dry ashing process for thinning the first photoresist again, and in particular, the thinning of the second photoresist may be carried out under an oxygen containing atmosphere, thus removing all of the fourth sub-photoresist 91 and a partial thickness of the fifth sub-photoresist 92. In particular, the fifth sub-photoresist 92 can be ashed to have a remaining thickness of about 0.2~1 μm. After the dry ashing process, states of the cross sections taken along the directions A-A, B-B in FIG. 13 are shown in FIG. 16, which illustrates a sectional view of the third state.

Figure 17:
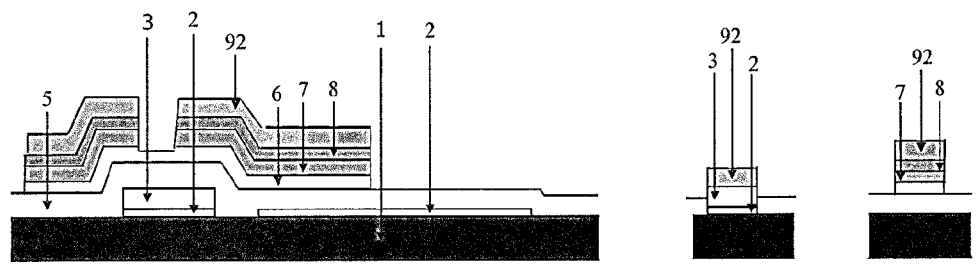
FIG. 17 is a sectional view along the C-C, D-D and E-E directions of FIG. 13 in the fourth state.

As shown in FIG. 17, etching process is performed on the substrate after the above steps to etch off a part of the N-type doped semiconductor layer 7 and the source-drain metal film 8 not protected by the second photoresist, thereby forming a pattern connecting the source electrode, the drain electrode, and the semiconductor silicon island. Preferably, in the etching process of this step, a part of themorphous silicon semiconductor film 6 not protected by the photoresist may be over etched, so as to prevent the remaining materials of the N-type semiconductor doped layer 7 and the source-drain metal film 8 affect the properties of the semiconductor silicon island. After this step, states of the cross sections taken along the directions C-C, D-D and EE in FIG. 13 are shown in FIG. 17, which illustrates a sectional view of the fourth state.

Figure 18:
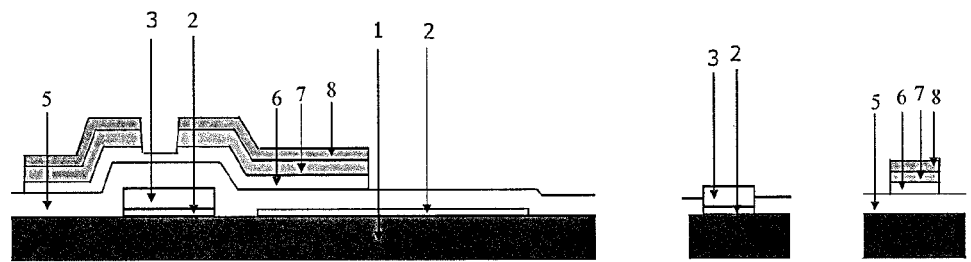
FIG. 18 is a sectional view along the C-C, D-D and E-E directions of FIG. 13 in the fifth state.

As shown in FIG. 18, stripping process is performed upon the substrate after the above steps to remove the remaining second photoresist. After this step, states of the cross sections taken along the directions C-C, D-D and E-E in FIG. 13 are shown in FIG. 18, which illustrates a sectional view in the fifth state.

After the above processes, an array substrate configuration is formed as shown in FIG. 13.

S115, a second transparent conductive film and a third photoresist are formed on the substrate after the above steps, and a pattern comprising the slit electrode is also formed in a patterning process.

Referring to FIGS. 1, 2, 19-22, optionally, this step may be carried out in the following manner. In particular, FIG. 1 is a structural schematic view of the array substrate formed after this step, FIGS. 2, 19-22 are sectional views of the cross sections taken along the directions F-F, G-G and H-H of FIG. 1 after the respective processing steps in different states. The cross section taken along the direction G-G is at a position where the gate line through hole is arranged, and the cross section taken along the direction H-H is at a position where the data line through hole is arranged.

Figure 19:
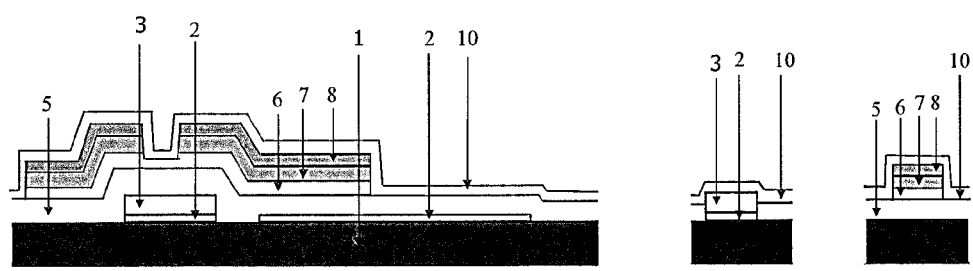
FIG. 19 is a sectional view along the F-F, G-G and H-H directions of FIG. 1 in the first state.

Firstly, a second transparent conductive film 10 is deposited on the substrate after the above steps. In particular, a layer of transparent conductive material with a thickness of 100~1000 Å is deposited on the substrate after the above steps by a sputtering or thermal evaporation process. The second transparent conductive film 10 may be made of a material such as ITO or IZO etc. The second transparent conductive film 10 is deposited at positions corresponding to the gate line through hole and the data line through hole. After this step, states of the cross sections taken along the directions F-F, G-G and H-H in FIG. 1 are shown in FIG. 19, which illustrates a sectional view of the first state.

Figure 20:
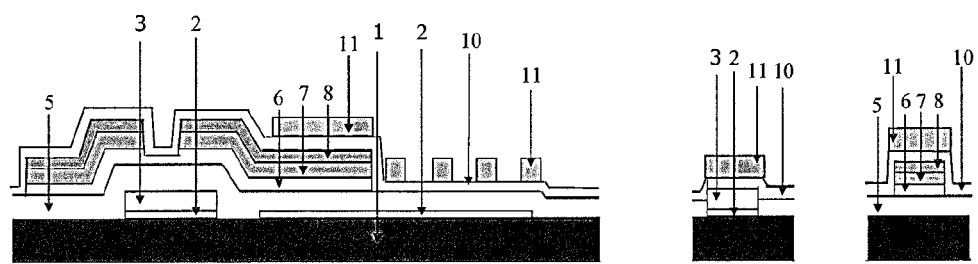
FIG. 20 is a sectional view along the F-F, G-G and H-H directions of FIG. 1 in the second state.

On the substrate 1 after the above steps, a third photoresist 11 is applied, and a pattern of the third photoresist 11 is formed in a patterning process. The pattern of the third photoresist 11 comprises a pattern at a position corresponding to the slit electrode, a pattern at a position corresponding to the gate line through hole, and a pattern at a position corresponding to the data line through hole. It should be noted, since the slit electrode is arranged corresponding to the plate electrode formed in the above steps, the position corresponding to the slit electrode 101 somewhat overlays with the position corresponding to the plate electrode 21 in FIG. 1. After this step, states of the cross sections taken along the directions F-F, G-G and H-H in FIG. 1 are shown in FIG. 20, which illustrates a sectional view in the second state.

Figure 21:
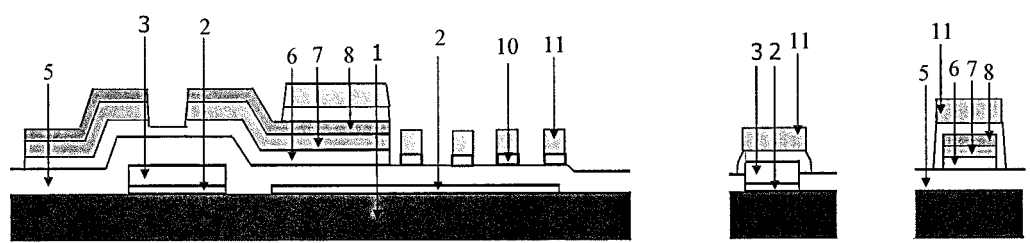
FIG. 21 is a sectional view along the F-F, G-G and H-H directions of FIG. 1 in the third state.

As shown in FIG. 21, the substrate after the above steps is subjected to an etching process, so as to etch off part of the second transparent conductive film 10 not protected by the photoresist, thus forming a pattern comprising the slit electrode. After this step, states of the cross sections taken along the directions F-F, G-G and H-H in FIG. 1 are shown in FIG. 21, which illustrates a sectional view in the third state. Preferably, when the above steps are completed, the third photoresist at positions corresponding to the slit electrode, the gate line through hole and the data line through hole remains, so as to continue the subsequent preparing steps of a passivation layer and forming the insulation protecting structure.

S116, a passivation layer is formed on the substrate after the above steps.

Figure 22:
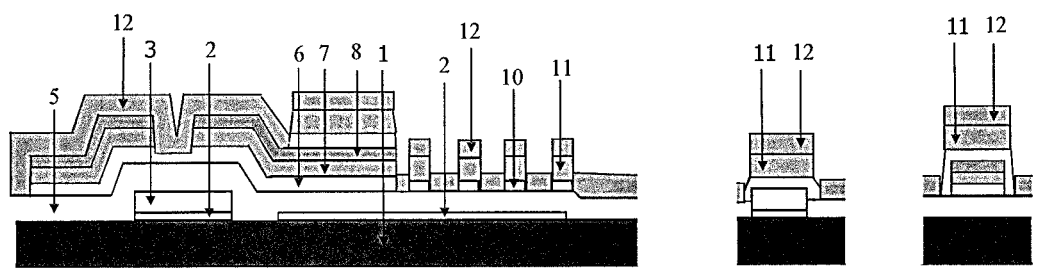
FIG. 22 is a sectional view along the F-F, G-G and H-H directions of FIG. 1 in the fourth state.

In this step, a passivation layer 12 is deposited on the substrate 1 after the above steps. In particular, the layer of passivation layer 12 with a thickness of 1000~6000 Å is deposited on the above substrate 1 by a chemical vapor deposition process. After this step, states of the cross sections taken along the directions F-F, G-G and H-H in FIG. 1 are shown in FIG. 22, which illustrates a sectional view in the fourth state.

S117, on the substrate after the above steps, the third photoresist at the positions corresponding to the slit electrode, the gate line through hole, and the data line through hole is removed, and at the same time, the passivation layer formed above the third photoresist at the positions corresponding to the slit electrode, the gate line through hole, and the data line through hole is removed, thus forming a pattern comprising the gate line through hole and the data line through hole.

In this step, as shown in FIG. 2, the third photoresist 11 at positions corresponding to the slit electrode, the gate line through hole and the data line through hole is removed by a stripping process. And the passivation layer 12 formed on the third photoresist 11 at positions corresponding to the slit electrode, the gate line through hole and the data line through hole is removed together, thereby forming an insulation protecting structure at positions corresponding to the source electrode, the drain electrode and the semiconductor silicon island, and forming the gate line through hole and the data line through hole. After this step, states of the cross sections taken along the directions F-F, G-G and H-H in FIG. 1 are shown in FIG. 2, which illustrates a sectional view of the fifth state.

After the above steps, an array substrate according to the embodiment of present invention is formed, as shown in FIGS. 1 and 2. The array substrate comprises: the substrate 1, the gate line 31, the gate electrode 32, the gate insulating film 5, the semiconductor silicon island 61, the source electrode 81, the drain electrode 82, the data line 83, and the slit electrode 101. Additionally, the substrate is provided with the gate line through hole 13 and the data line through hole 14. The gate line 31 and the gate electrode 32 comprise metal materials and the first transparent conductive material, the slit electrode 101 and the drain electrode 82 are directly connected. Hence, the steps for providing the insulating layer and making the via holes are eliminated. The second transparent conductive material is connected to the gate line 31 through the gate line through hole 13; and the second transparent conductive material is connected to the data line 83 through the data line through hole 14. The gate line through hole 13 and the data line through hole 14 are formed during the fabrication process, rather than in a patterning process after the formation of the passivation layer, thus reducing the number of the patterning processes required by the array substrate and improving the yield of the array substrate.

In the fabricating method of an array substrate of the embodiment of present invention, the gate metal film is directly arranged on the first transparent conductive film, thereby a pattern comprising the gate electrode, the gate line, the plate electrode is obtained in a single patterning process. The second transparent conductive film is directly arranged on the source-drain metal film, so that the slit electrode is directly connected with the drain electrode without providing additional via hole. Furthermore, the gate line through hole and the data line through hole are formed during the fabrication process, and no separate patterning process is needed to form the gate line through hole and the data line through hole. According to the fabricating method of an array substrate, the array substrate and the display device of the embodiment of present invention, the number of the patterning process is reduced to three, thus the cost is reduced effectively and the yield is improved.

In yet another aspect, the embodiment of present invention also provides a display device, the array substrate of which comprises the array substrate cited in the above embodiments, thus the structure of the array substrate and the preparing method are the same as those described above and no details is repeated herein. In addition, the configuration for other parts of the display device may be conventional, no detailed description is made herein.

In particular, the display device according to the embodiment of present invention may be a liquid crystal panel, an electronic paper, a liquid crystal TV, a liquid crystal display monitor, a digital frame, a tablet and any products or components with a display function.

According to the display device of the embodiment of present invention, the number of the patterning processes required by the array substrate of the display device can be reduced to three, thus enabling reduction of the production costs and improvement of the yield.

The above embodiments are only exemplary embodiments of the present invention, rather than limiting the protective scope of the present invention. The protection scope of the present invention is defined by the accompanying claims.

What is claimed is:

1. An array substrate comprising a substrate; a plate electrode, a gate electrode, a gate line, a gate insulating film, a semiconductor silicon island, a source electrode, a drain electrode, a data line, a slit electrode formed on the substrate, and the substrate is also provided with a gate line through hole and a data line through hole, wherein
    the gate electrode and the gate line comprise a first transparent conductive material and a gate metal material stacked sequentially;
    the slit electrode is directly connected to the drain electrode;
    a second transparent conductive material is connected to the gate line through the gate line through hole; and connected to the data line through the data line through hole,
    wherein the gate insulating film is arranged between the gate electrode and the semiconductor silicon island as well as between the plate electrode and the slit electrode.

2. The array substrate according to claim 1, wherein the plate electrode and the first transparent conductive material are arranged at the same layer and made of the same material.

3. The array substrate according to claim 1, wherein the slit electrode and the second transparent conductive material are arranged at the same layer and made of the same material.

4. The array substrate according to claim 1, wherein the source electrode and the drain electrode are arranged above the semiconductor silicon island, and the array substrate further comprise a semiconductor layer arranged below the data line and at the same layer with the semiconductor silicon island.

5. The array substrate according to claim 1, wherein the array substrate further comprise an insulation protecting structure above the source electrode, the drain electrode, the data line and the semiconductor silicon island.

6. A display device comprising an array substrate comprising a substrate, a plate electrode, a gate electrode, a gate line, a gate insulating film, a semiconductor silicon island, a source electrode, a drain electrode, a data line, a slit electrode formed on the substrate, and the substrate is also provided with a gate line through hole and a data line through hole, wherein
    the gate electrode and the gate line comprise a first transparent conductive material and a gate metal material stacked sequentially;
    the slit electrode is directly connected to the drain electrode;
    a second transparent conductive material is connected to the gate line through the gate line through hole; and connected to the data line through the data line through hole,
    wherein the gate insulating film is arranged between the gate electrode and the semiconductor silicon island as well as between the plate electrode and the slit electrode.

7. The display device according to claim 6, wherein the plate electrode and the first transparent conductive material are arranged at the same layer and made of the same material.

8. The display device according to claim 6, wherein the slit electrode and the second transparent conductive material are arranged at the same layer and made of the same material.

9. The display device according to claim 6, wherein the source electrode and the drain electrode are arranged above the semiconductor silicon island, and the array substrate further comprises a semiconductor layer arranged below the data line and at the same layer with the semiconductor silicon island.

10. The display device according to claim 6, wherein the array substrate further comprises an insulation protecting structure above the source electrode, the drain electrode, the data line and the semiconductor silicon island.

11. A fabricating method of an array substrate, comprising following steps of:
    forming a first transparent conductive film and a gate metal film sequentially, forming a first photoresist on the gate metal film, forming a pattern comprising a gate electrode, a gate line, and a plate electrode by a patterning process, and keeping a part of the first photoresist at a position corresponding to a gate line through hole;
    forming a gate insulating film, a semiconductor film and a source-drain metal film sequentially;
    removing the first photoresist at the position corresponding to the gate line through hole, and at the same time removing the gate insulating film, the semiconductor film and the source-drain metal film formed above the first photoresist at a position corresponding to the gate line through hole;
    forming a second photoresist, and forming a pattern comprising a source electrode, a drain electrode, a data line and a semiconductor silicon island by a patterning process; and
    forming a second transparent conductive film, a third photoresist, and forming a pattern comprising a slit electrode by a patterning process.

12. The fabricating method according to claim 11, wherein the step of forming the second transparent conductive film, the third photoresist and forming the pattern comprising the slit electrode by the patterning process comprises: forming a pattern comprising the slit electrode and keeping the third photoresist at a position corresponding to the slit electrode, the gate line through hole and a data line through hole.

13. The fabricating method according to claim 12, wherein after the step of forming the second transparent conductive film, the third photoresist and forming the pattern comprising the slit electrode by the patterning process, the fabricating method further comprises:
forming a passivation layer; and
removing the third photoresist at a position corresponding to the slit electrode, the gate line through hole, and the data line through hole, and at the same time, removing the passivation layer formed above the third photoresist at the position corresponding to the slit electrode, the gate line through hole and the data line through hole, so as to form a passivation layer pattern comprising the gate line through hole and the data line through hole.

14. The fabricating method according to claim 11, wherein the step of forming the first photoresist, forming a pattern comprising the gate electrode, the gate line, and the plate electrode by the patterning process and keeping the first photoresist at the position corresponding to the gate line through hole comprises steps of:
forming the first photoresist;
forming a first sub-photoresist at a position corresponding to the gate electrode and the gate line, forming a second sub-photoresist at a position corresponding to the plate electrode, and forming a third sub-photoresist at a position corresponding to the gate line through hole, by the patterning process; and the third sub-photoresist has a thickness greater than that of the first sub-photoresist, and the thickness of the first sub-photoresist is greater than that of the second sub-photoresist;
removing the first transparent conductive film and the gate metal film not covered by the first sub-photoresist, the second sub-photoresist and the third sub-photoresist;
removing all the second sub-photoresist, and removing partial thickness of the first and third sub-photoresist;
removing the gate metal film corresponding to the second sub-photoresist so as to form a pattern comprising the plate electrode; and
removing the remaining first sub-photoresist to expose the pattern comprising the gate line and the gate electrode, and removing partial thickness of the third sub-photoresist and keeping the remaining third sub-photoresist.

15. The fabricating method according to claim 14, wherein the first sub-photoresist has a thickness of 1-4 μm, the second sub-photoresist has a thickness of 0.5-2 μm, and the third sub-photoresist has a thickness of 2-6 μm.

16. The fabricating method according to claim 11, wherein the step of forming the second photoresist, and forming a pattern comprising the source electrode, the drain electrode, the data line and the semiconductor silicon island comprises the steps of:
forming the second photoresist;
forming a fourth sub-photoresist at a position corresponding to the semiconductor silicon island, and forming a fifth sub-photoresist at a position corresponding to the source electrode, the drain electrode, the data line, the gate line through hole and the data line through hole; and the fifth sub-photoresist has a thickness greater than that of the fourth sub-photoresist;
removing the semiconductor film and the source-drain metal film not covered by the fourth sub-photoresist and the fifth sub-photoresist;
removing all the fourth sub-photoresist and partial thickness of the fifth sub-photoresist;
removing the source-drain metal film and a part of the semiconductor film at a position corresponding to the fourth sub-photoresist, so as to form a pattern comprising the source electrode, the drain electrode, the data line and the semiconductor silicon island; and
removing the remaining fifth sub-photoresist.

17. The fabricating method according to claim 16, wherein the fourth sub-photoresist has a thickness of 0.5-1 μm, and the fifth sub-photoresist has a thickness of 1-2 μm.

18. The fabricating method according to claim 16, wherein the semiconductor film comprises an amorphous semiconductor film and a doped semiconductor film stacked sequentially, and the step of removing the source-drain metal film and a part of the semiconductor film at a position corresponding to the fourth sub-photoresist comprises:
removing the source-drain metal film and the doped semiconductor film at the position corresponding to the fourth sub-photoresist to expose the semiconductor film.

* * * * *